United States Patent
Morooka et al.

(10) Patent No.: US 7,354,857 B2
(45) Date of Patent: Apr. 8, 2008

(54) METHOD OF MAKING IRON SILICIDE AND METHOD OF MAKING PHOTOELECTRIC TRANSDUCER

(75) Inventors: Hisao Morooka, Chuo-ku (JP); Hiroshi Yamada, Chuo-ku (JP); Kazuo Nishi, Atsugi (JP)

(73) Assignees: TDK Corporation, Tokyo (JP); Semiconductor Energy Laboratory Co., Ltd., Kanagawa (JP)

( * ) Notice: Subject to any disclaimer, the term of this patent is extended or adjusted under 35 U.S.C. 154(b) by 131 days.

(21) Appl. No.: 11/206,999

(22) Filed: Aug. 19, 2005

(65) Prior Publication Data

US 2006/0003585 A1 Jan. 5, 2006

Related U.S. Application Data

(62) Division of application No. 10/756,299, filed on Jan. 14, 2004, now Pat. No. 6,949,463.

(30) Foreign Application Priority Data

Jan. 16, 2003 (JP) ............................. 2003-008725

(51) Int. Cl.
*H01L 21/44* (2006.01)
(52) U.S. Cl. ......................... 438/682; 257/53
(58) Field of Classification Search .................. 257/53, 257/458, 384, 656, 454, 456, E31.061, E29.336; 438/682, 583, 630, 649, 651, 655, 664
See application file for complete search history.

(56) References Cited

U.S. PATENT DOCUMENTS

| | | | |
|---|---|---|---|
| 3,927,225 A | | 12/1975 | Cordes et al. |
| 4,218,291 A | | 8/1980 | Fukuyama et al. |
| 4,633,033 A | * | 12/1986 | Nath et al. .................. 136/256 |
| 4,705,912 A | * | 11/1987 | Nakashima et al. ........ 136/258 |
| 4,713,493 A | * | 12/1987 | Ovshinsky .................. 136/249 |
| 4,765,845 A | * | 8/1988 | Takada et al. .............. 136/258 |
| 4,926,230 A | * | 5/1990 | Yamagishi et al. ......... 136/249 |
| 5,127,964 A | * | 7/1992 | Hamakawa et al. ........ 136/256 |
| 5,288,684 A | | 2/1994 | Yamazaki et al. |
| 5,507,881 A | * | 4/1996 | Sichanugrist et al. ....... 136/258 |
| 5,681,402 A | * | 10/1997 | Ichinose et al. ............ 136/256 |

(Continued)

FOREIGN PATENT DOCUMENTS

JP    A 4-210463    7/1992

(Continued)

*Primary Examiner*—Thao P. Le
(74) *Attorney, Agent, or Firm*—Oliff & Berridge, PLC

(57) ABSTRACT

A solar cell comprises a substrate, and a metal electrode layer, a p-i-n junction, and a transparent electrode layer which are successively laminated on the substrate. The p-i-n junction comprises an n layer, an i layer, and a p layer which are laminated in this order. The i layer is made of an amorphous iron silicide film containing hydrogen in accordance with the present invention, and is formed on the n layer by supplying an iron vapor into a plasma of a material gas in which a silane type gas and a hydrogen gas are mixed. In the i layer, dangling bonds of silicon atoms and/or iron atoms are terminated with hydrogen, whereby a number of trap levels which may occur in the amorphous iron silicide film are eliminated.

4 Claims, 11 Drawing Sheets

U.S. PATENT DOCUMENTS

| | | | | |
|---|---|---|---|---|
| 5,741,615 A | * | 4/1998 | Saitoh et al. | 430/58.1 |
| 6,229,766 B1 | * | 5/2001 | Saurer et al. | 368/205 |
| 2002/0058387 A1 | * | 5/2002 | Ito | 438/308 |
| 2002/0117025 A1 | * | 8/2002 | Uchikoshi et al. | 75/626 |
| 2003/0176270 A1 | * | 9/2003 | Gegner | 501/96.2 |

FOREIGN PATENT DOCUMENTS

| | | |
|---|---|---|
| JP | A 7-166323 | 6/1995 |
| JP | A 10-130826 | 5/1998 |
| JP | A 2000-178713 | 6/2000 |
| JP | A 2001-64099 | 3/2001 |
| JP | A 2002-47569 | 2/2002 |

* cited by examiner

METHOD OF MAKING IRON SILICIDE AND METHOD OF MAKING PHOTOELECTRIC TRANSDUCER

This is a Division of application Ser. No. 10/756,299 filed Jan. 14, 2004, now U.S. Pat. No. 6,949,463 issued Sep. 27, 2005, which claims priority from Japanese Patent Application No. 2003-008725 filed in Japan on Jan. 16, 2003. The entire disclosure of the prior applications is hereby incorporated by reference herein in their entirety.

BACKGROUND OF THE INVENTION

1. Field of the Invention

The present invention relates to a method and apparatus for making an iron silicide film, a method and apparatus for making an photoelectric transducer, and a method and apparatus for making a photoelectric transducer unit.

2. Related Background Art

In recent years, compound semiconductors have widely been used in various optical devices, electronic devices, other devices, and the like. Among them, silicide semiconductors have been developed vigorously as materials which can exhibit excellent electric, optical, magnetic, and thermoelectric characteristics due to their complicated and diversified combining modes. Examples of silicide semiconductors include transitional metal silicide semiconductors typified by iron silicide, and alkaline earth silicide semiconductors typified by calcium silicide and magnesium silicide. In particular, attention has been focused on iron silicide as a material which is quite usable in practice and less influential on environments, since its constituent elements are iron and silicon which exhibit a low environmental load and a long resource life, its lattice mismatching with a typically employed silicon substrate is less, and so forth.

In general, iron silicide which is expressed by $Fe_xSi_y$, exhibits a plurality of crystal phases depending on its growth condition and the composition ratio (x:y) between iron and silicon atoms. In crystalline iron silicide, only $\beta$-$FeSi_2$ has been known to have a semiconductor characteristic. $\beta$-$FeSi_2$ directly has a bandgap (where Eg is about 1.85 eV) in a 1.55-μm band as an optical communication wavelength. Using its heterojunction with a silicon layer, LED and PD which can emit light at room temperature have been developed. Also, since $\beta$-$FeSi_2$ is less influential on environments as mentioned above, and has a bandgap different from that of crystalline silicon and amorphous silicon while exhibiting a relatively large absorption coefficient for light having a long wavelength, it is useful as an i layer of a p-i-n junction constituting a photoelectric transducer.

Various techniques have been proposed for $\beta$-$FeSi_2$ and its forming methods. Examples of typical techniques include SPE (Solid Phase Epitaxy), RDE (Reactive Deposition Epitaxy), IBS (Ion Beam Synthesis), MBE (Molecular Beam Epitaxy), PLD (Pulsed Laser Deposition), and MOCVD (Metal organic Chemical Vapor Deposition).

Specifically, SPE and RDE are methods in which elementary iron or iron silicide is deposited onto a silicon substrate and then is heated to 500° C. or higher, or iron is deposited onto a substrate at a temperature of 400° C. or higher, so as to form the aimed compound by a solid-phase reaction between iron and silicon. More specifically, a method in which silicide is deposited by PVD onto a substrate at a temperature of 200° C. to 600° C. and then is annealed at a temperature of 500° C. to 900° C. (see Japanese Patent Application Laid-Open No. HEI 4-210463), a method in which iron is deposited by PVD onto a substrate at a temperature of 625° C. to 725° C. and then is annealed at a temperature of 625° C. to 725° C. for 60 minutes (see Japanese Patent Application Laid-Open No. HEI 7-166323), and a method in which silicide is formed at a substrate temperature of 400° C. to 700° C. (550° C. to 650° C. in examples) by sputtering using a krypton or xenon gas (see Japanese Patent Application Laid-Open No. 2001-64099) have been proposed.

MOCVD is a kind of thermal CVD using a mixed gas formed by an iron-containing organic gas such as ferrocene or iron carbonyl and a silicon-atom-containing gas. More specifically, a method forming iron silicide at a substrate temperature of 500° C. by using a mixed gas of iron pentacarbonyl and monosilane has been proposed (see Japanese Patent Application Laid-Open No. 2002-47569).

IBS is a method in which a substrate is irradiated with ion beams of elements or compounds constituting a material, so as to deposit silicide thereon, and can form silicide by processing at a relatively low temperature. More specifically, a method in which a silicon substrate heated at 300° C. is alternately irradiated with iron and silicon ion beams, so as to form iron silicide has been proposed (see Japanese Patent. Application Laid-Open No. HEI 10-130826). PLD is a film-forming method using laser abrasion with pulse laser adapted to yield a high output, and can form silicide by processing at a relatively low temperature. More specifically, a method in which iron silicide is formed by using ArF excimer laser at a substrate temperature of 100° C. to 400° C. has been proposed (Japanese Patent Application Laid-Open No. 2000-178713).

SUMMARY OF THE INVENTION

Meanwhile, in order for the above-mentioned conventional SPE and PDE to form iron silicide by solid phase growth, and in order for the MOCVD to eliminate impurities in films derived from organic materials while silane type gases must be dissociated, heat treatment at a high temperature exceeding 400° C. to 500° C. is essentially required during or after forming an iron silicide film.

If such high temperature treatment is carried out when making a photoelectric transducer using $\beta$-$FeSi_2$ in a semiconductor layer, for example, the amount of heat inputted to the substrate to be formed with a device may increase so as to change the form thereof. Using a highly heat resistant substrate for preventing such a problem from occurring increases the material cost, and the thermal budget of other layers (other semiconductor layers, electrode layers, protective layers, functional layers, etc.) constituting the device, which may adversely affect natures and characteristics of layers (films) and device characteristics while increasing restrictions on the process.

In recent years, electronic devices such as photoelectric transducers have further been desired to reduce their thickness and weight, whereby thin members such as heat-resistant resin films have been likely to be employed as a support in place of the silicon substrate or the like, and their development has been advancing. However, such a resin film deforms plastically in an environment at several hundred degrees, and thus is very hard to employ the SPE, PDE, and MOCVD which require high-temperature treatment of 500° C. or higher in the forming process as mentioned above.

When the temperature condition in the SPE, PDE, and MOCVD is alleviated so as to try to form $\beta$-$FeSi_2$ in heat treatment at a temperature of 400° C. or lower, for example, silicide crystals may not grow sufficiently, so that iron silicide which is substantially amorphous or made of microcrystals may occur. According to the knowledge of the inventors, a large number of bonding defects are likely to be included in such amorphous or microcrystal iron silicide, whereby numerous trap levels at different energy levels exist because of modes of these bonding defects.

If an i layer including such a large number of bonding defects absorbs light and forms a photoelectron/hole pair, a plurality of trap levels will inhibit carrier transfer in the process of carrier migration within the layer. As a consequence, semiconductor characteristics required for the i layer may not be exhibited, whereby the layer may fail to act as a photoelectric transducer.

While the IBS using ion beams and the PLD based on pulse laser abrasion can form an iron silicide film at a relatively low temperature as mentioned above, they are hard to yield a sufficient film thickness and uniform film quality when employed for forming a semiconductor layer constituting a device for a photoelectric transducer unit which requires a larger area such as solar cell, for example, and may not establish a device. Also, the energy required for making a film tends to be greater than in other methods. In particular, when they are employed for making a device having a large area, the manufacturing cost increases disadvantageously, thereby worsening the economy, which is not practical.

In view of such circumstances, it is an object of the present invention to provide a method and apparatus for making an iron silicide film, which can easily make an iron silicide film having a favorable film quality while being adapted to exhibit semiconductor characteristics and employable in a device having a large area. It is another object of the present invention to provide a method and apparatus for making a photoelectric transducer having excellent device characteristics by comprising such an iron silicide film, and a method and apparatus for making a photoelectric transducer unit comprising this device.

(1) The present invention provides a method of making an iron silicide film having a semiconductor characteristic, the method comprising a pressure adjusting step of keeping a fixed pressure about a substrate; a substrate heating step of heating the substrate; a gas supplying step of supplying a material gas including a silicon-atom-containing gas and a hydrogen gas to the substrate; a plasma forming step of applying a high-frequency power onto a region opposing the substrate so as to form a plasma including a chemical species derived from the material gas; and an iron supplying step of supplying an iron atom to the substrate.

In thus configured method of making an iron silicide film, active species derived from silicon atoms and/or hydrogen atoms formed by a plasma of a material gas including a silicon-atom-containing gas and a hydrogen gas and various chemical species including iron atoms are supplied onto a substrate heated in an atmosphere held at a fixed pressure. Their various reactions proceed on the surface of the substrate, thereby forming an iron silicide film including hydrogen atoms.

The inventors evaluated optical characteristics of an iron silicide film formed with a relatively low heating temperature of less than 400° C. for an Si wafer acting as a substrate in the substrate heating step, and have found that the film exhibits semiconductor characteristics. As mentioned above, iron silicide films formed at such a low temperature tend to become mainly amorphous (may include microcrystals), and may generate bonding defects mainly due to uncombined hands (dangling bonds) of silicon atoms and/or iron atoms.

As a consequence, a number of trap levels at different energy levels exist because of modes of these bonding defects, whereby the film tends to fail to function as a semiconductor. The fact that the iron silicide film obtained by the making method of the present invention exhibits semiconductor characteristics in spite of the conventional tendency is presumed to be because hydrogen atoms are bound to uncombined hands as if to terminate dangling bonds. Namely, thus obtained iron silicide film is considered to be mainly amorphous and made of hydrogen-containing iron silicide ($Fe_xSi_y$:H).

Specific forms of discharging in the plasma forming step are not restricted in particular, whereas examples thereof include DC glow discharging using plane parallel electrodes, DC arc discharging by plasma jet, capacitive coupling type high-frequency discharging using plane parallel electrodes, capacitive or inductive coupling type high-frequency discharging using coil coupling type external electrodes, internal or external microwave discharging, and ECR discharging combining a magnetic field with a high-frequency electric field.

Preferably, in the pressure adjusting step, the fixed pressure is adjusted such that the iron silicide film attains a semiconductor characteristic. While the pressure about the substrate has a correlation with the concentration of chemical species such as active species, the possibility of colliding with neutral gases within a plasma space may rise disadvantageously depending on the ambient pressure and other film-forming conditions, whereby a sufficient amount of chemical species (reactive substances) may not reach the substrate surface. In particular, iron atoms have a greater mass than that of chemical species derived from the silicon-containing gas and hydrogen gas and thus seem to be more likely to be inhibited from migrating, whereby iron atoms are considered to be relatively hard to reach the substrate among various chemical species. For preventing this from happening, control for regulating the pressure about the substrate becomes effective.

Specifically, it is preferred that the fixed pressure be held at a value within the range from 0.01 to 27 Pa in the pressure adjusting step. When the fixed pressure is less than 0.01 Pa, the discharge is likely to become unstable, whereby it is harder to form active species required for forming a film sufficiently. When the fixed pressure exceeds 27 Pa, on the other hand, it may be harder to supply a sufficient amount of iron atoms onto the substrate.

It is also preferred that a temperature of the substrate be adjusted in the substrate heating step such that the iron silicide film includes a hydrogen atom and that the hydrogen atom content in the iron silicide film becomes a given value selected from within a predetermined range.

While the iron silicide film formed by the making method of the present invention includes a hydrogen atom which can eliminate bonding defects, hydrogen may be desorbed from within the film depending on the temperature condition of the film. Also, details of whether dangling bonds are terminated with the equivalent amount of bonding defects or not are unclear. The possibility of hydrogen being physically occluded in the film cannot be denied. Further, the temperature of the substrate is assumed to be greatly influential on the stability and film quality (i.e., the amount of generated bonding defects) of the iron silicide structure. Therefore, for sufficiently eliminating the bonding defects in the iron silicide film, control for regulating the temperature of the substrate is effective.

Specifically, in the substrate heating step, the substrate is heated so as to attain a temperature within the range of preferably at least 100° C. but less than 400° C., more preferably 150° C. to 350° C., 200° C. to 350° C. in particular. When the substrate temperature is less than 100° C., bonding defects in the film tend to increase in excess. When the substrate temperature is 400° C. or higher, on the other hand, the amount of heat inputted to the substrate increases in excess while the desorption of hydrogen from the iron silicide film tends to be harder to suppress sufficiently. The hydrogen desorption suppressing effect increases remarkably when the substrate temperature is 350° C. or lower in particular.

More specifically, it is further preferred that the predetermined range of hydrogen atom content in the iron silicide film in the substrate heating step be 1 to 25 atom %. The amount of bonding defects included in the amorphous iron silicide is presumed to be usually 1 atom % or less, mostly 0.1 atom % or less, in terms of atoms. According to the knowledge of the inventors, bonding defects which can occur in an i layer is hard to eliminate sufficiently if the content of hydrogen atoms in the i layer is less than 1 atom %. When the hydrogen atom content exceeds 25 atom %, on the other hand, the decrease in efficiency of photoelectric conversion may become remarkable.

In the gas and iron supplying steps, it will be useful if the ratio between the silicon-atom-containing gas supply amount and the iron atom supply amount is adjusted such that the iron silicide film attains a semiconductor characteristic. While the crystalline iron silicide film having a semiconductor characteristic is a film made of $\beta$-FeSi$_2$, the iron silicide film obtained by the present invention is mainly amorphous, and details of whether the stoichiometry between iron and silicon atoms is equivalent to their composition ratio or not are unclear. According to the knowledge of the inventors, though iron and silicon atoms have substantially the same bandgap Eg, the ratio of x:y in the iron silicide film (Fe$_x$Si$_y$:H) obtained by the present invention is about 1:2 and may considerably fluctuate. Therefore, control for regulating the amounts of supply of silicon-atom-containing gas and iron atoms, which are considered to be factors dominating the composition ratio, is useful.

More specifically, in the gas and iron supplying steps, it is preferred that the ratio between the flow rate of supply of the silicon-atom-containing gas and the amount of supply of the iron atom be adjusted such that the ratio (x:y) between the iron and silicon atoms in the iron silicide (Fe$_x$Si$_y$) film falls within the range of 1:1.7 to 1:3.5. This makes it easier for the iron silicide film to exhibit a semiconductor characteristic.

In the gas supplying step, it will be preferred if the amount of supply of the hydrogen gas is adjusted such that the iron silicide film includes a hydrogen atom and that the hydrogen atom content in the iron silicide film is a given value selected from within a predetermined range. The hydrogen atom content in the iron silicide film is considered to be susceptible to the substrate temperature as mentioned above, and depend on the amount of hydrogen supplied as a material, whereby control for regulating the hydrogen gas supply amount also becomes effective. It is desirable that the predetermined range of hydrogen atom content in the iron silicide film be 1 to 25 atom % in the gas supplying step in this case as well.

(2) The present invention provides an apparatus for making an iron silicide film having a semiconductor characteristic, the apparatus being used for effectively carrying out the iron silicide film in accordance with the present invention; the apparatus comprising a chamber for accommodating a substrate; a substrate supporting part, placed within the chamber, for supporting the substrate; a pressure adjusting part, connected to the chamber, for keeping a fixed pressure within the chamber; a substrate heating part for heating the substrate; a gas supplying part, connected to the chamber, for supplying a material gas including a silicon-atom-containing gas and a hydrogen gas into the chamber; a plasma forming part for applying a high-frequency power onto a region opposing the substrate within the chamber so as to form a plasma including a chemical species derived from the material gas; and an iron supplying part for supplying an iron atom to the substrate. Specific forms of discharging used in the plasma forming part are not restricted in particular, whereby the above-mentioned various modes of discharging can be used.

Preferably, the apparatus further comprises a pressure controlling part, connected to the pressure adjusting part, for regulating the fixed pressure such that the iron silicide film attains a semiconductor characteristic.

Preferably, the apparatus further comprises a substrate temperature controlling part, connected to the substrate heating part, for regulating a temperature of the substrate such that the iron silicide film includes a hydrogen atom and that the hydrogen atom content in the iron silicide film becomes a given value selected from within a predetermined range.

It will be useful if the apparatus further comprises a first supply amount controlling part, connected to the gas and iron supplying parts, for regulating the ratio between the silicon-atom-containing gas supply amount and the iron atom supply amount such that the iron silicide film attains a semiconductor characteristic.

It will also be preferred if the apparatus further comprises a second supply amount controlling part, connected to the gas supplying part, for regulating the hydrogen gas supply amount such that the iron silicide film includes a hydrogen atom and that the hydrogen atom content in the iron silicide film becomes a given value selected from within a predetermined range.

(3) The present invention provides a method of making a photoelectric transducer, the method being effectively carried out by using the method of making an iron silicide film in accordance with the present invention, the method comprising a p layer forming step of forming a p layer on a substrate; an n layer forming step of forming an n layer such that the n layer opposes the p layer; and an i layer forming step of forming an i layer including an iron silicide film between the p and n layers, the i layer forming step comprising a pressure adjusting step of keeping a fixed pressure about the substrate, a substrate heating step of heating the substrate, a gas supplying step of supplying a material gas including a silicon-atom-containing gas and a hydrogen gas to the substrate, a plasma forming step of applying a high-frequency power onto a region opposing the substrate so as to form a plasma including a chemical species derived from the material gas, and an iron supplying step of supplying an iron atom to the substrate.

(4) The present invention provides an apparatus for making a photoelectric transducer, the apparatus being used for effectively carrying out the method of making a photoelectric transducer in accordance with the present invention, the apparatus comprising a p layer forming part for forming a p layer on a substrate; an n layer forming part for forming an n layer such that the n layer opposes the p layer; and an i layer forming part for forming an i layer including an iron silicide film between the p and n layers; the i layer forming part comprising a chamber for accommodating the substrate; a substrate supporting part, placed within the chamber, for supporting the substrate; a pressure adjusting part, connected to the chamber, for keeping a fixed pressure within the chamber; a substrate heating part for heating the substrate; a gas supplying part, connected to the chamber, for supplying a material gas including a silicon-atom-containing gas and a hydrogen gas into the chamber; a plasma forming part for applying a high-frequency power onto a region opposing the substrate within the chamber so as to form a plasma including a chemical species derived from the material gas; and an iron supplying part for supplying an iron atom to the substrate.

(5) The present invention provides a method of making a photoelectric transducer unit, the method being effectively carried out by using the method of making an iron silicide film in accordance with the present invention, the method comprising a first electrode layer forming step of forming a first electrode layer on one side of a substrate; a second electrode layer forming step of forming a second electrode layer such that the second electrode layer opposes the first electrode layer; an n layer forming step of forming an n layer on the first electrode layer; a p layer forming step of forming a p layer on one side of the second electrode layer such that the p layer opposes the n layer; and an i layer forming step of forming an i layer including an iron silicide film between the p and n layers, the i layer forming step comprising a pressure adjusting step of keeping a fixed pressure about the substrate, a substrate heating step of heating the substrate, a gas supplying step of supplying a material gas including a silicon-atom-containing gas and a hydrogen gas to the substrate, a plasma forming step of applying a high-frequency power onto a region opposing the substrate so as to form a plasma including a chemical species derived from the material gas, and an iron supplying step of supplying an iron atom to the substrate.

(6) The present invention provides an apparatus for making a photoelectric transducer unit, the apparatus being used for effectively carrying out the method of making a photoelectric transducer in accordance with the present invention, the apparatus comprising a first electrode layer forming part for forming a first electrode layer on one side of a substrate; a second electrode layer forming part for forming a second electrode layer such that the second electrode layer opposes the first electrode layer; an n layer forming part for forming an n layer on the first electrode layer; a p layer forming part for forming a p layer on one side of the second electrode layer such that the p layer opposes the n layer; and an i layer forming part for forming an i layer including an iron silicide film between the p and n layers; the i layer forming part comprising a chamber for accommodating the substrate; a substrate supporting part, placed within the chamber, for supporting the substrate; a pressure adjusting part, connected to the chamber, for keeping a fixed pressure within the chamber; a substrate heating part for heating the substrate; a gas supplying part, connected to the chamber, for supplying a material gas including a silicon-atom-containing gas and a hydrogen gas into the chamber; a plasma forming part for applying a high-frequency power onto a region opposing the substrate within the chamber so as to form a plasma including a chemical species derived from the material gas; and an iron supplying part for supplying an iron atom to the substrate.

DESCRIPTION OF THE PREFERRED EMBODIMENTS

In the following, preferred embodiments of the present invention will be explained with reference to the accompanying drawings. Constituents identical to each other will be referred to with numerals or letters identical to each other without repeating their overlapping explanations.

Figure 1:
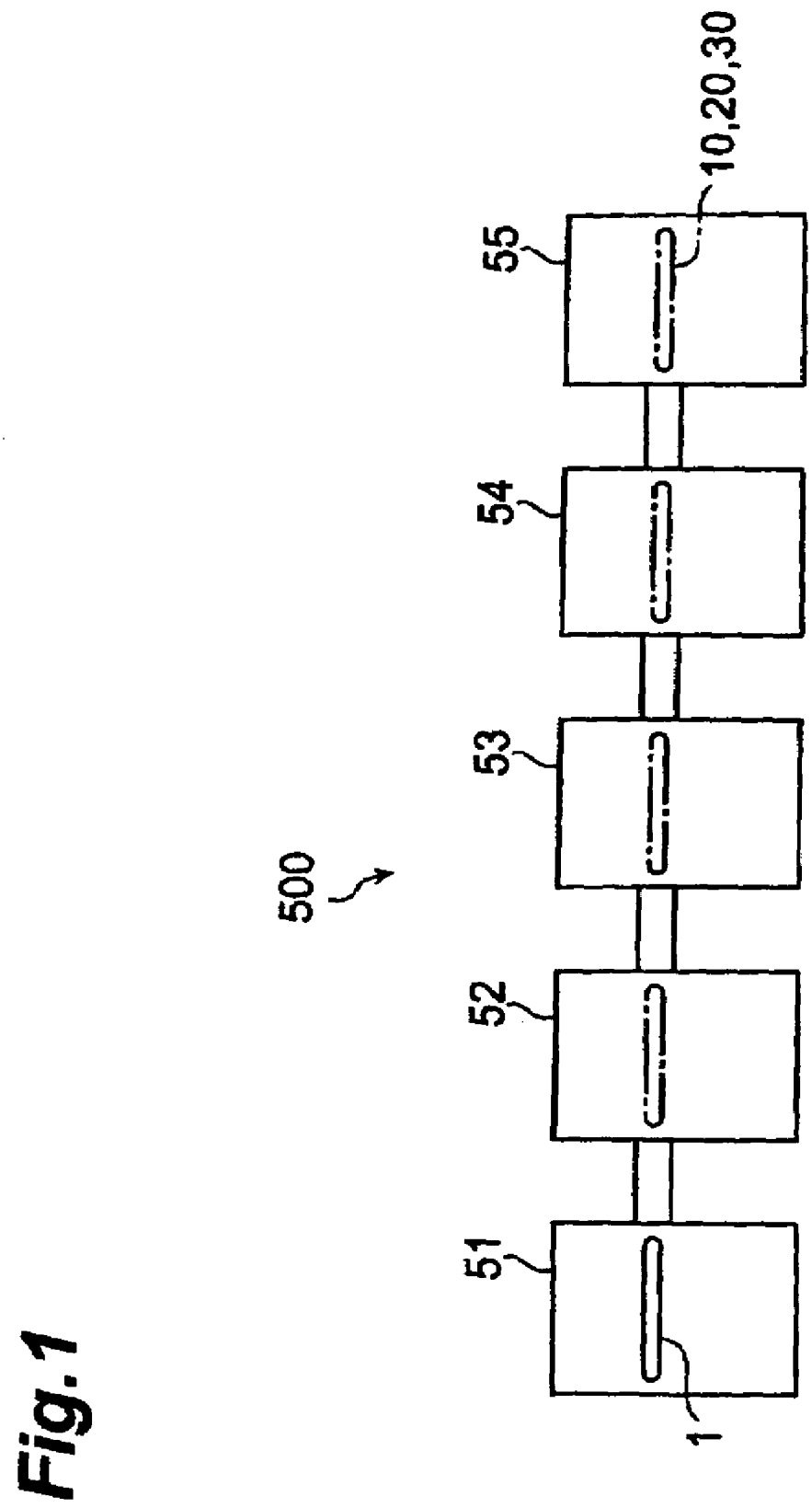
FIG. 1 is a diagram for schematically showing a preferred embodiment of the apparatus for making a photoelectric transducer unit in accordance with the present invention.

FIG. 1 is a diagram schematically showing a preferred embodiment of the apparatus for making a photoelectric transducer in accordance with the present invention. The solar cell manufacturing system 500 (apparatus for making a photoelectric transducer unit) comprises a chamber 51 (first electrode forming part) for accommodating a substrate 1 such as Si wafer and forming a metal electrode layer onto the support 1 by PVD, a chamber 52 (n layer forming part) for forming an n layer by CVD, a chamber 53 (i layer forming part, i.e., an apparatus for making a photoelectric transducer), a chamber 54 (p layer forming part) for forming a p layer by CVD, and a chamber 55 (second electrode forming part) for forming a transparent electrode layer by PVD which are provided in succession from the upstream side. The substrate 1 is successively transferred from the chamber 51 to its downstream chambers 52 to 55, where respective predetermined layers are formed, whereby solar cells 10 to 30 which will be explained later are obtained.

Figure 2:
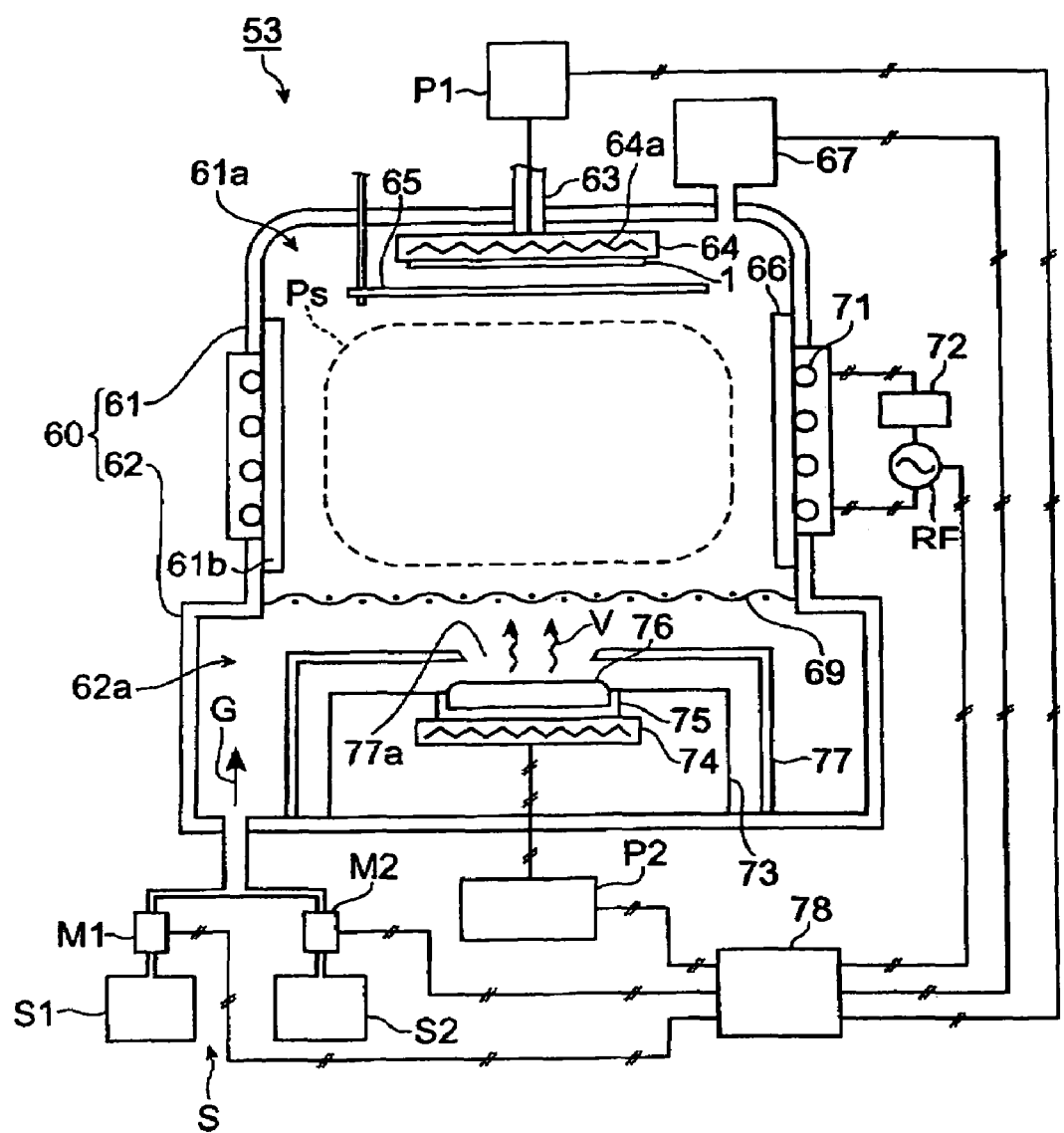
FIG. 2 is a schematic sectional view showing the configuration of a main part of a chamber 53 constituting a solar cell manufacturing system 500.

FIG. 2 is a schematic sectional view showing the configuration of a main part of the chamber 53 constituting the solar cell manufacturing system 500. The chamber 53 comprises a chamber body 60 constituted by an upper chamber 61 and a lower chamber 62. On the inside of the upper end of the lower chamber 62, i.e., on the inside of the lower end of the upper chamber 61, a mesh electrode 69 is disposed. The upper chamber 61 and the mesh electrode 69 define a plasma forming chamber 61a, whereas the lower chamber 62 and the mesh electrode 69 define an iron evaporation chamber 62a. The plasma forming chamber 61a and the iron evaporation chamber 62a communicate with each other.

A plurality of support rods 63 penetrate through the upper wall of the upper chamber 61, whereas a substrate support table 64 (substrate supporting part) for holding the substrate 1 such that its film-forming surface faces down (i.e., in a facedown fashion) is placed at an end part of the support rod 63 located on the upper side within the upper chamber 61. Provided within the substrate support table 64 is a heater 64a (substrate heating part) connected to a power supply P1. A shutter 65 is rotatably disposed at a position opposing the substrate 1 held by the substrate support table 64.

Connected to the upper wall of the upper chamber 61 is an exhaust system 67 (pressure adjusting part) having a turbo pump and the like. A part of the side wall of the upper chamber 61 is constituted by a tubular waveguide wall 61b formed from ceramics such as glass. Surrounding the waveguide wall 61b is a coil 71, made of a metal such as copper, forming an L coupling with a high-frequency power supply RF which will be explained later. Connected to the coil 71 are an impedance matching device 72 and the high-frequency power supply RF. Thus, in this embodiment, the coil 71, impedance matching device 72, and high-frequency power supply RF constitute a plasma forming part.

Placed on the bottom wall of the lower chamber 62 is an iron material support table 73 in which a heater 74 connected to a power supply P2 is provided. Disposed on the heater 74 is a boat 75, made of tungsten, on which an iron ingot 76 is mounted. Thus, in this embodiment, the iron material support table 73, heater 74, boat 75, and iron ingot 76 constitute an iron supplying part. Placed on the bottom wall of the lower chamber 62 is an adhesion prevention cover 77 which surrounds the iron material support table 73. A part opposing the boat 75 in the attachment prevention cover 77 is formed with an opening 77a.

Connected to the bottom wall of the lower chamber 62 is a material gas supply system S (gas supplying part) having a gas source S1 for storing a silane type gas such as monosilane gas and a gas source S2 for storing a hydrogen gas. Pipes for connecting the gas sources S1, S2 to the lower chamber 62 are provided with mass flow controllers (MFC) M1, M2, respectively. Connected to the power supplies P1, P2, mass flow controllers M1, M2, and high-frequency power supply RF is a controller 78 which can regulate their outputs.

Thus, in this embodiment, the exhaust system 67 and controller 78 constitute a pressure controlling part. The power supply P1 and controller 78 constitute a substrate temperature controlling part. The mass flow controller M1, power supply P2, and controller 78 constitute a first supply amount controlling part. The mass flow controller M2 and controller 78 constitute a second supply amount controlling part.

Figure 3:
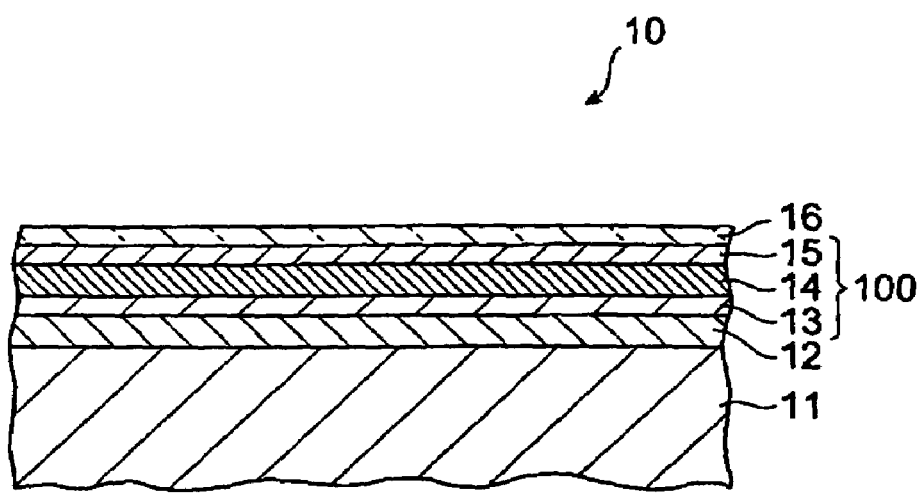
FIG. 3 is a schematic sectional view showing the structure of a first embodiment of the photoelectric transducer unit in accordance with the present invention comprising a photoelectric transducer in accordance with the present invention.

An example of solar cell obtained by using thus configured solar cell manufacturing system 500 will now be explained with reference to FIG. 3. FIG. 3 is a schematic sectional view showing the structure of a first embodiment of the photoelectric transducer unit in accordance with the present invention comprising the photoelectric transducer in accordance with the present invention. The solar cell 10 (photoelectric transducer unit) comprises the photoelectric transducer of the present invention. In the solar cell 10, on a substrate 11 such as Si wafer 1 or a film made of polyamide resin or polyimide resin, a metal electrode layer 12, a p-i-n junction 100 (first p-i-n junction part, i.e., photodetector), and a transparent electrode layer 16 are laminated successively.

Though the material for the metal electrode layer 12 is not restricted in particular, it is preferably constituted by a material which has a predetermined high electric conductivity and is hard to be damaged by a high-temperature atmosphere of about 400° C., while exhibiting a very low reactivity with each of layers (which will be explained later) constituting the p-i-n junction. Preferred examples of such a material include noble metals such as Au, Pt, Pd, Ir, and Ag; noble metal alloys such as Au—Pd, Au—Pt, Ag—Pd, and Ag—Pt; and alloys mainly composed of a noble metal such as Ag—Pd—Cu with base metal elements added thereto. The metal electrode layer 12 usually has a thickness on the order of 0.1 to 1 μm, for example.

The transmission electrode layer 16 is located on the light-receiving surface side of the solar cell 10, and is constituted by a transparent electrically conductive material. As the transparent electrically conductive material, electrically conductive oxide materials such as $In_2O_3$, $SnO_2$, ITO, and ZnO—Al can be used, for example. The transparent electrode layer 16 usually has a thickness of about 0.05 to 1 μm, for example.

The p-i-n junction 100 comprises the metal electrode layer 12, and an n layer 13, an i layer 14 (iron silicide film), and a p layer 15 which are successively laminated on the metal electrode layer 12. An example of the n layer 13 is an n-type silicon layer The n-type silicon layer is not restricted in particular as long as it is employable in a p-i-n junction for use in solar cells in general, and may be a layer including a crystal phase or an amorphous layer. When using a silicon layer, examples of impurities (dopants) for providing an n type include atoms of V-family elements (phosphorous, arsenic, antimony, and the like). The n layer 13 usually has a thickness on the order of 10 to 100 nm, for example.

The i layer 14 is made of iron silicide ($Fe_xSi_y$:H) including a hydrogen atom and is mainly amorphous (may be constituted by or include a micryscystal phase as mentioned above), i.e., does not substantially include monocrystal and polycrystal components. The hydrogen atom content in the i layer 14 is preferably 1 to 25 atom %, more preferably 5 to 20 atom %. It will usually be preferred if the thickness of the i layer 14 is on the order of 0.1 to 10 μm, for example.

In the present invention, the hydrogen atom content in the i layer 14 can be determined from the value of hydrogen amount ($H_2$:M/S=2) degassed from within the film measured by thermal desorption spectroscopy (TDS). It has been seen that the i layer 14 exhibits an optical bandgap of Eg(opt)≈0.85 eV, an I-V characteristic inherent in a semiconductor, and a transmission characteristic with respect to light having a wavelength longer than the optical wavelength (about 1500 nm) corresponding to the Eg. Since this Eg substantially equals the Eg of β-$FeSi_2$, the composition ratio between iron and silicon atoms in the i layer 14 is inferred to be a value in the vicinity of x:y≈1:2.

However, it has been seen that the composition ratio between iron and silicon atoms in the i layer 14 estimated from a material composition ratio, at which the i layer 14 can exhibit a semiconductor characteristic, determined while variously changing the ratio of material supply amounts, i.e., the amounts of supply of the above-mentioned silicon-containing gas and iron vapor, fluctuates considerably about the value of x:y≈1:2 (from about 1:1.7 to about 1:3.5 in some cases). Details of whether or not the i layer 14 has a stoichiometry equivalent to that of crystalline β-$FeSi_2$ have not been elucidated yet, and the possibility of the i layer 14 exhibiting a semiconductor characteristic by a mechanism different from that of conventional β-FeSi$_2$ cannot be denied.

An example of the p layer 15 is a p-type silicon layer. The p-type silicon layer is not restricted in particular as long as it is employable in a p-i-n junction for use in solar cells in general, and may be a layer including a crystal phase or an amorphous layer. When using a silicon layer, examples of impurities (dopants) for providing a p type include atoms of III-family elements (boron, aluminum, gallium, and the like). The p layer 15 usually has a thickness of about 10 to 100 nm, for example.

Figure 4:
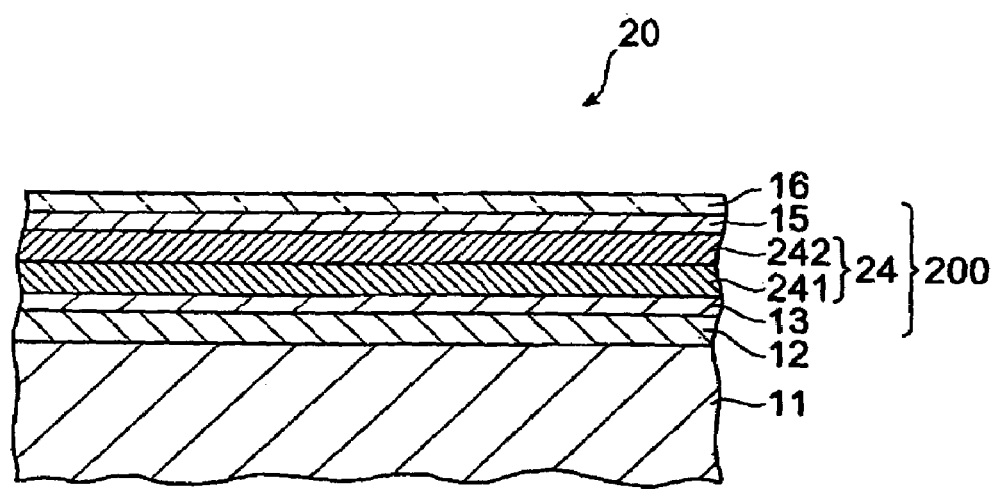
FIG. 4 is a schematic sectional view showing the structure of a second embodiment of the photoelectric transducer unit in accordance with the present invention comprising a photoelectric transducer in accordance with the present invention.

FIG. 4 is a schematic sectional view showing the structure of a second embodiment of the photoelectric transducer unit in accordance with the present invention. The solar cell 20 (photoelectric transducer unit) comprises the photoelectric transducer in accordance with the present invention, and has the same configuration as with the solar cell 10 shown in FIG. 3 except that it comprises a p-i-n junction 200 (first p-i-n junction part) in place of the p-i-n junction 100. The p-i-n junction 200 has the same configuration as with the p-i-n junction 100 of the solar cell 10 except that a composite i layer 24 is provided in place of the i layer 14.

The composite i layer 24 comprises an i layer 241 (first i layer, i.e., iron silicide film) made of amorphous Fe$_x$Si$_y$:H formed on the p layer 13, and an i layer 242 (second i layer) made of amorphous silicon laminated on the first i layer 241. Namely, the solar cell 20 is a hybrid photoelectric transducer unit in which a plurality of different kinds of i layers are laminated. The i layer 241 has a structure similar to that of the above-mentioned i layer 14, and can be formed as with the i layer 14. The i layer 242 usually has a thickness on the order of 100 to 500 nm, for example.

In thus configured solar cell 20, the i layer 241 exhibits a higher absorption coefficient for low-energy photons (long-wavelength photons) than does the i layer 242, so that photons having a relatively short wavelength among those incident on the i layer 242 are photoelectrically converted at a higher efficiency, whereas those having a relatively long wavelength are transmitted through the i layer 242 so as to be made incident on the i layer 241. The photons having a relatively long wavelength are photoelectrically converted and absorbed by the i layer 241. Thus, the absorption wavelength region of the solar cell 20 as a whole can be expanded, whereby a greater current can be obtained at the same voltage as compared with the solar cell 10.

Figure 5:
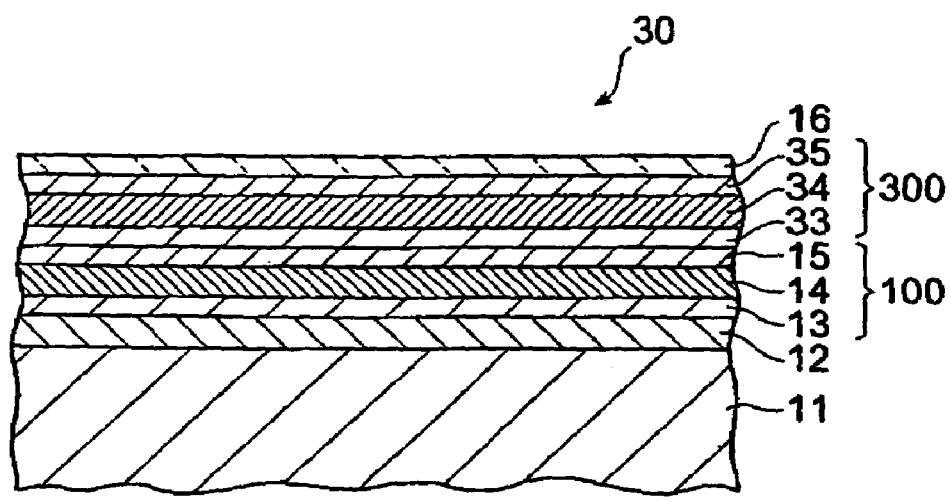
FIG. 5 is a schematic sectional view showing the structure of a third embodiment of the photoelectric transducer unit in accordance with the present invention comprising a photoelectric transducer in accordance with the present invention.

FIG. 5 is a schematic sectional view showing the structure of a third embodiment of the photoelectric transducer unit in accordance with the present invention. The solar cell 30 (photoelectric transducer unit) comprises the photoelectric transducer of the present invention, and has the same configuration as with the solar cell 10 shown in FIG. 3 except that it further comprises a p-i-n junction 300 (second p-i-n junction part) between the p-i-n junction 100 and the transparent electrode layer 16. The p-i-n junction 300 comprises an n layer 33 (second n layer) formed as with the n layer 13, a p layer 35 (second p layer) formed as with the p layer 15, and an i layer 34 (third i layer) disposed therebetween and made of amorphous silicon as with the i layer 242.

Thus configured solar cell 30 is a tandem photoelectric transducer unit in which the p-i-n junctions 100, 300 are disposed in series. Among photons incident on the i layer 34 of the p-i-n junction 300 through the transparent electrode layer 16, those having a relatively short wavelength are photoelectrically converted thereby at a relatively high efficiency, whereas those having a relatively long wavelength are transmitted through the i layer 34, so as to be made incident on the i layer 14 of the p-i-n junction 100. The photons having a relatively long wavelength are photoelectrically converted and absorbed by the i layer 14. Therefore, the solar cell 30 is advantageous over the solar cell 10 in that it can attain a higher output voltage.

Figure 6:
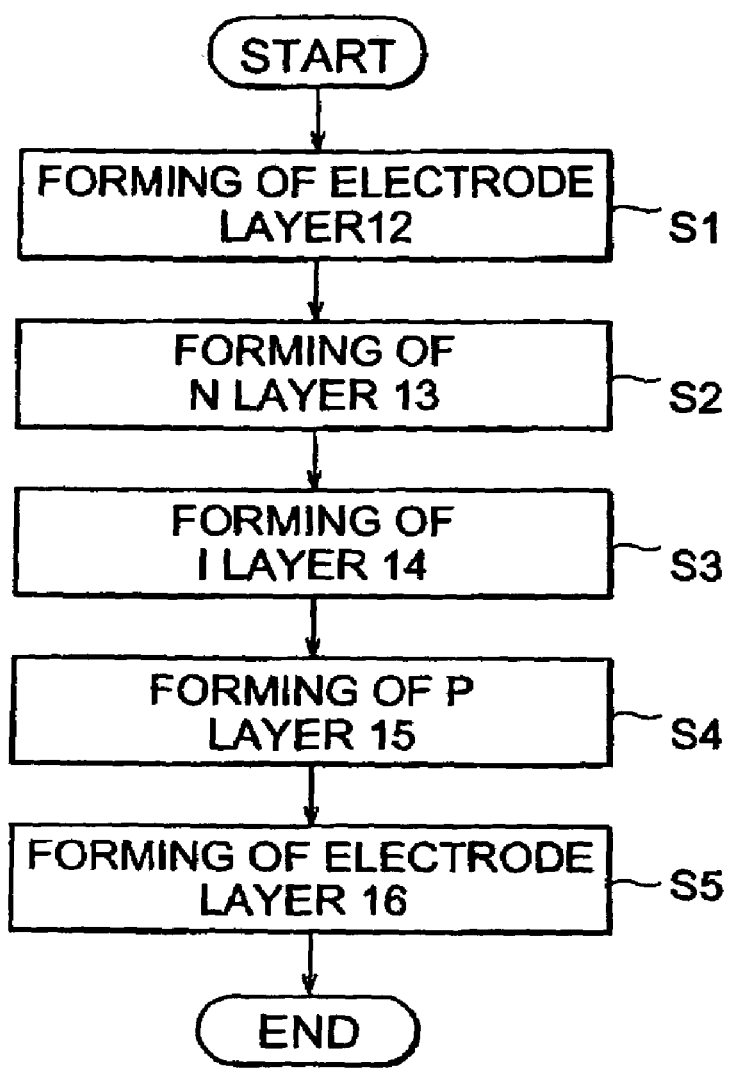
FIG. 6 is a flowchart showing an example of procedure for carrying out a method of making a solar cell 10.

An example of method of making the solar cell 10 by using the solar cell manufacturing system 500 and the method of making a photoelectric transducer unit in accordance with the present invention will now be explained. FIG. 6 is a flowchart showing an example of procedure for carrying out the method of making the solar cell 10. First, processing is started, so as to accommodate a substrate 11 (which is an Si wafer 1 here) into the chamber 51 (see FIG. 1). In the chamber 51, a metal electrode layer 12 is formed by PVD such as sputtering on one side of the Si wafer 1 (step S1; first electrode layer forming step). Subsequently, the Si wafer 1 is transferred into the chamber 52, in which an n layer 13 is formed on the metal electrode layer 12 by CVD such as plasma CVD and thermal CVD (step S2; n layer forming step).

Next, the Si wafer 1 is transferred to the chamber 53 (see FIG. 2), in which an i layer 14 is formed on the n layer 13 (step S3; i layer forming step). The operating control for the following members constituting the chamber 53 is carried out according to control signals from the controller 78. Then, while an inert gas or the like (not depicted) is circulated within the chamber body 60 if necessary, the exhaust system 67 is operated so as to evacuate/vacuum the chamber body 60 (pressure adjusting step). At the same time, the heater 64a is energized, so as to heat the Si wafer 1 to a predetermined temperature (substrate heating step).

When a fixed pressure is attained within the chamber body 60, the mass flow controllers M1, M2 are operated so as to supply a silane type gas and a hydrogen gas into the chamber body 60 at predetermined supply flow rates (gas supplying step). In the following processing operations, the exhaust system 67 is continuously operated, so as to keep a fixed pressure within the chamber body 60 (pressure adjusting step). The silane type gas and hydrogen gas are mixed together so as to yield a material gas G before flowing into the chamber body 60. The material gas G circulates from the iron evaporation chamber 62a to the plasma forming chamber 61a along the exhaust flow.

Simultaneously with the supply of the material gas G, the heater 74 is energized, so as to heat and melt the iron ingot 76 on the boat 75, thereby evaporating iron, thus generating an iron vapor V (iron supplying step). The iron vapor V passes through the opening 77a of the adhesion prevention cover 77, and circulates from the iron evaporation chamber 62a to the plasma forming chamber 61a along the exhaust flow. Here, the adhesion prevention cover 77 keeps the iron vapor from disadvantageously adhering to the inner wall of the chamber body 60. At the same time, the high-frequency power supply RF and the impedance matching device 72 are operated so as to apply a high-frequency power at a predetermined frequency and a predetermined output. As a consequence, a plasma (sheath) Ps is formed by inductive coupling type high-frequency discharging within the plasma forming chamber 61a (plasma forming step). The mesh electrode 69 prevents the plasma Ps from entering the iron evaporation chamber 62a side. After the plasma Ps is stabilized, the shutter 65 is rotated, so as to expose the film-forming surface of the Si wafer 1 to the plasma Ps.

In the plasma Ps, atoms and active species (ions, nonneutral radicals, neutral radicals, and the like of various chemical species) derived from the silane type gas and hydrogen gas, and iron atoms and iron active species (ions, nonneutral radicals, neutral radicals, and the like) derived from the iron vapor exist. The chamber body 60 is evacuated from the upper wall side of the upper chamber 61, i.e., the rear side of the Si wafer 1, so that the active species in the plasma are drawn onto the Si wafer 1. As a consequence, iron silicide including hydrogen atoms grows by deposition due to a chemical reaction, whereby an i layer 14 composed of a mainly amorphous hydrogen-atom-containing iron silicide film is formed.

Here, the fixed pressure within the chamber body 60 (i.e., the pressure about the Si wafer 1) is preferably 0.01 to 27 Pa. When the fixed pressure is less than 0.01 Pa, the plasma (sheath) Ps required for forming a film is harder to form. When the fixed pressure exceeds 27 Pa, on the other hand, iron atoms are harder to supply onto the Si wafer 1 by a sufficient amount.

The heating temperature (substrate temperature) of the Si wafer 1 is preferably at least 100° C. but less than 400° C., more preferably 150° C. to 350° C., 200° C. to 350° C. in particular. When the substrate temperature of the Si wafer 1 is less than 100° C., bonding defects in the i layer 14 tend to increase in excess. This is presumed to be because of the fact that active species do not diffuse sufficiently on the surface of the Si wafer 1. When the substrate temperature is 400° C. or higher, on the other hand, the amount of heat inputted to the Si wafer 1 tends to increase in excess while it becomes harder to suppress the desorption of hydrogen from the i layer 14 sufficiently. When the substrate temperature of the Si wafer 1 is 350° C. or lower in particular, the desorption of hydrogen from the i layer 14 can be suppressed more sufficiently.

Further, the i layer 14 is transferred into the chamber 54, in which a p layer 15 is formed on the i layer 14 by CVD such as plasma CVD and thermal CVD (step S4; p layer forming step). Thus, a p-i-n junction part 100 is formed on the metal electrode layer 12. Then, the Si wafer 1 is transferred into the chamber 55, in which a transparent electrode layer 16 is formed by PVD such as sputtering (step S5; second electrode layer forming step), whereby the solar cell 10 is obtained.

In such iron silicide film, photoelectric transducer, and method and apparatus for making a photoelectric transducer unit in accordance with the present invention, the i layer 14 is formed by mainly amorphous iron silicide ($Fe_xSi_y$:H) including hydrogen atoms and exhibits a semiconductor characteristic, whereby the p-i-n junction 100 functions as an excellent photoelectric transducer. Namely, among photons incident on the p-i-n junction 100 through the transparent electrode layer 16, those having an energy wavelength greater than the bandgap energy Eg of the i layer 14 are photoelectrically converted within the i layer 14, so as to form a photoelectron/hole pair, which yields a high photoelectric conversion efficiency as a battery.

This is presumed to be because of the fact that at least a part of hydrogen atoms included combine with uncombined hands of silicon atoms and/or iron atoms, i.e., dangling bonds which may occur in amorphous iron silicide are terminated by hydrogen atoms, whereby bonding defects within the i layer 14 are eliminated. It seems that a plurality of trap levels are prevented from occurring because of such bonding defects, whereby carriers are transported smoothly in the process of carrier migration within the i layer 14.

Also, since the i layer 14 is formed by $Fe_xSi_y$:H which is mainly amorphous as such, high-temperature treatment on the order of 400° C. to 800° C., which has been required for forming conventional crystalline β-$FeSi_2$, is unnecessary in its forming process. This can remarkably reduce the amount of heat inputted to the substrate 11, thereby restraining the substrate 11 from denaturing/deforming. The reduction in the amount of heat inputted lowers thermal budget, whereby thermal influences on the metal electrode layer 12 and n layer 13 can be eliminated.

As the substrate 11, it is not necessary to use one having a high thermal resistance which is relatively expensive, whereby the manufacturing cost of the solar cell 10 can be cut down. Since low-temperature treatment (process) can be employed, a heat-resistant resin film can be used as the substrate 11, whereby the solar cell 10 can further reduce its thickness and weight.

When the hydrogen atom content in the i layer 14 is 1 atom % or greater, the termination of dangling bonds (which is conceptually "filling" of bonding defects) can sufficiently be promoted. When the hydrogen atom content in the i layer 14 is 20 atom % or less, on the other hand, the photoelectric conversion efficiency can sufficiently be suppressed. Also, the iron ingot 76 is evaporated so as to atomize iron, which is then mixed with silicon and hydrogen active species within the plasma Ps, whereas the resulting mixture reaches the Si wafer 1 (substrate 11), whereby a film is formed by a vapor phase reaction in a state close to CVD, which is suitable for forming a device having a large area.

Without being restricted to the embodiments mentioned above, the present invention can be modified in various manners within the scope not deviating from the gist thereof. For example, the chamber 53 for forming the i layer 14 may be a faceup type chamber which holds the Si wafer 1 such that its film-forming surface faces up. For example, in this case, the material gas may be supplied from a shower head, whereas a high-frequency power may be applied to the shower head, so as to form a plasma. The processing scheme of the Si wafer 1 is not limited to single-wafer processing, but may be batch processing as well. Further, as mentioned above, the present invention can be employed for a substrate such as a heat-resistant resin film because of low-temperature treatment.

Figure 7:
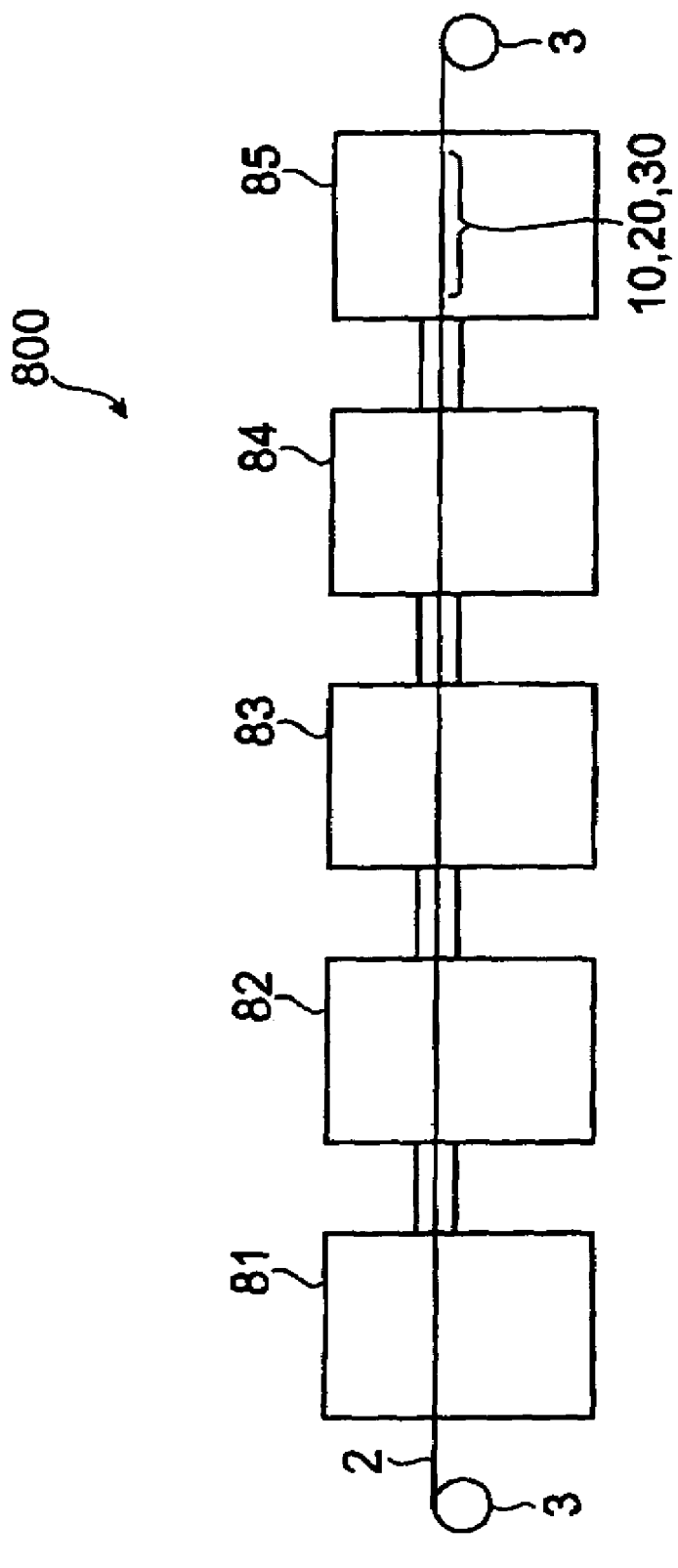
FIG. 7 is a diagram schematically showing another preferred embodiment of the apparatus for making a photoelectric transducer unit in accordance with the present invention.

FIG. 7 is a diagram schematically showing another preferred embodiment of apparatus for making a photoelectric transducer unit in accordance with the present invention. The solar cell manufacturing system 800 (apparatus for making a photoelectric transducer unit) comprises a chamber 81 (first electrode forming part) for accommodating a substrate 2 such as a sheet-like resin film wound about a roll 3 and forming a metal electrode layer onto the substrate 2 by PVD, a chamber 82 (n layer forming part) for forming an n layer by CVD, a chamber 83 (i layer forming part, i.e., an apparatus for making a photoelectric transducer), a chamber 84 (p layer forming part) for forming a p layer by CVD, and a chamber 85 (second electrode forming part) for forming a transparent electrode layer by PVD which are provided in succession from the upstream side. The sheet-like substrate 2 is successively transferred from the chamber 81 to its downstream chambers 82 to 85, where respective predetermined layers are formed, whereby the above-mentioned solar cells 10 to 30 are obtained.

The p and n layers in the p-i-n junctions 100, 200, 300 may be exchanged. Though the metal electrode layer 12 and transparent electrode layer 16 may be exchanged, it is desirable that the i layer 242 in the solar cell 20 be disposed upstream from the i layer 241 with respect to the direction of incidence of light, and that the p-i-n junction 300 in the solar cell 30 be disposed upstream from the p-i-n junction 100 with respect to the direction of incidence of light. Instead of heating the iron ingot 76 with a heater, other heating means such as evaporation by electron beams may be used for generating an iron atom vapor.

Details of the present invention will now be explained more specifically with reference to examples, which do not restrict the present invention.

EXAMPLE 1

As a substrate, an Si wafer having a main surface with a surface orientation of (100) was accommodated in the upper part within a chamber, so as to be secured to a support table in a facedown fashion. The chamber was evacuated from the upper side of the chamber (the upper wall of the chamber opposing the rear side of the Si wafer) such that the pressure within the chamber became 1.33 Pa. While maintaining this pressure, a monosilane ($SiH_4$) gas and a hydrogen ($H_2$) gas each at a flow rate of 50 sccm were supplied into the chamber, and a high-frequency power of 50 W was applied to an L-coupling copper coil disposed about the chamber, so as to form a plasma of a mixed gas constituted by the monosilane gas and hydrogen gas.

Simultaneously with the forming of plasma, an iron ingot placed below the Si wafer was heated to about 1900° C. by resistance heating, and the iron vapor generated upon evaporation of iron was supplied into the plasma along the exhaust flow within the chamber. Further, the heater attached to the support table was energized, so as to heat the Si wafer to a substrate temperature of 250° C. As a consequence, amorphous $Fe_xSi_y$:H was deposited on the Si wafer, so as to form the iron silicide film having a thickness of 300 nm in accordance with the present invention. The hydrogen atom content in the iron silicide film was determined from the amount of dissociated gas obtained by the above-mentioned TDS, and was found to be 12.5 atom %.

COMPARATIVE EXAMPLE 1

As a substrate, an Si wafer having a main surface with a surface orientation of (100) was accommodated in a PVD chamber, so as to be secured to a support table, and the chamber was evacuated such that the pressure within the chamber became 1.33 Pa. A heater attached to the support table was energized, so as to heat the Si wafer to a substrate temperature of 250° C. While maintaining the pressure, an Ar gas was supplied into the PVD chamber at a flow rate of 40 sccm, and a high-frequency power of 100 W was applied thereto, so as to generate Ar ions, which were made incident on an iron silicide target placed within the chamber so as to oppose the Si wafer. As a consequence, sputtering particles of iron silicide were deposited on the Si wafer, so as to form an iron silicide film having a thickness of 300 nm.

Figure 8:
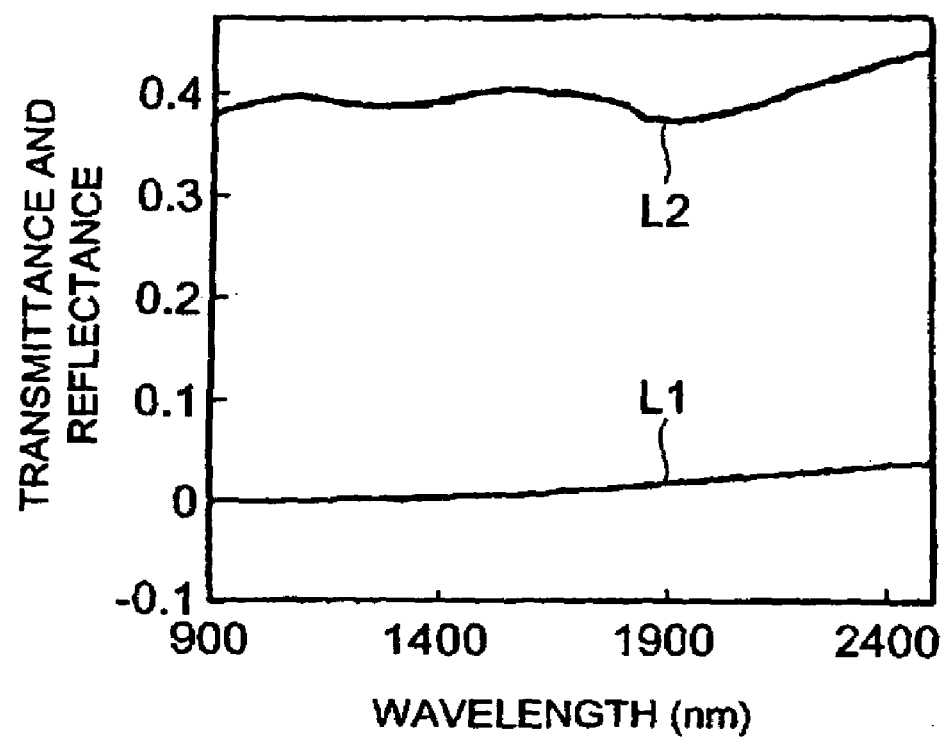
FIG. 8 is a graph showing the spectral transmittance and reflectance of the iron silicide film obtained by Example 1.
Figure 9:
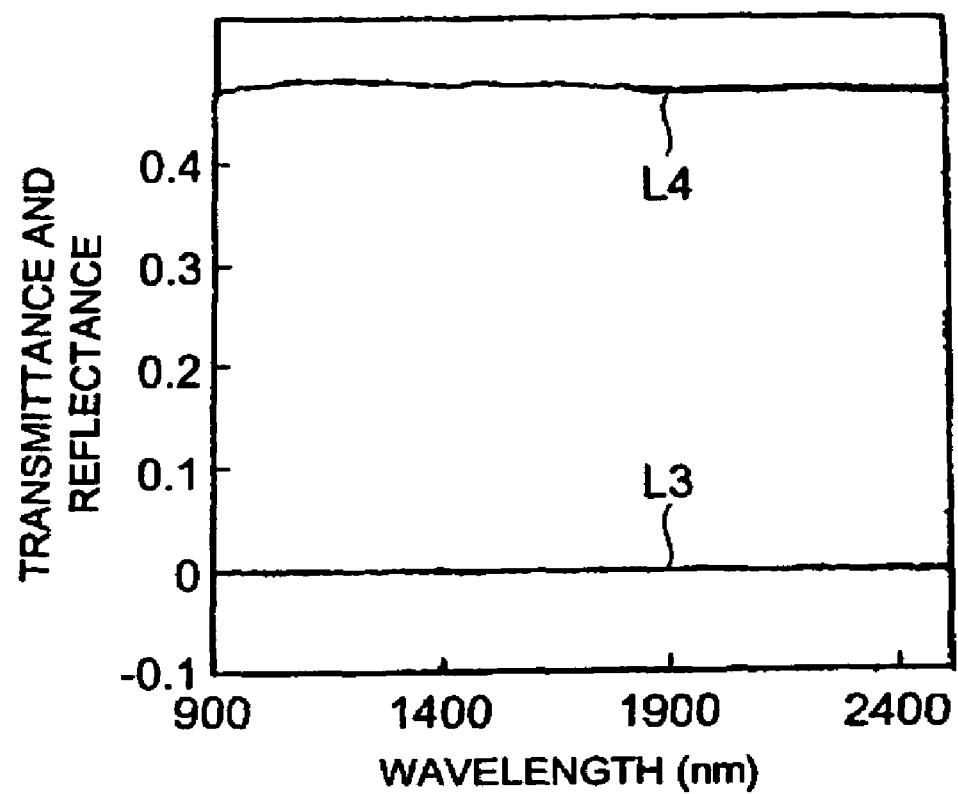
FIG. 9 is a graph showing the spectral transmittance and reflectance of the iron silicide film obtained by Comparative Example 1.

Physical Property Evaluation of Iron Silicide Film (1) Using u-400 (product name) manufactured by Hitachi, Ltd., the transmittance and reflectance of each of the iron silicide films obtained by Example 1 and Comparative Example 1 were measured. FIGS. 8 and 9 are graphs showing respective spectral transmittance and reflectance characteristics of the iron silicide films obtained by Example 1 and Comparative Example 1. In these charts, curves L1 and L3 show spectral transmittance curves, whereas curves L2 and L4 show spectral reflectance curves. These results have verified that each of the iron silicide films of Example 1 and Comparative Example 1 reflects at least light having a wavelength of 900 to 2400 nm. It has also been seen that the iron silicide film of Example 1 transmits light having a wavelength of about 1500 nm or longer, whereas the iron silicide film of Comparative Example 1 does not transmit light in the wavelength region indicated.

Figure 10:
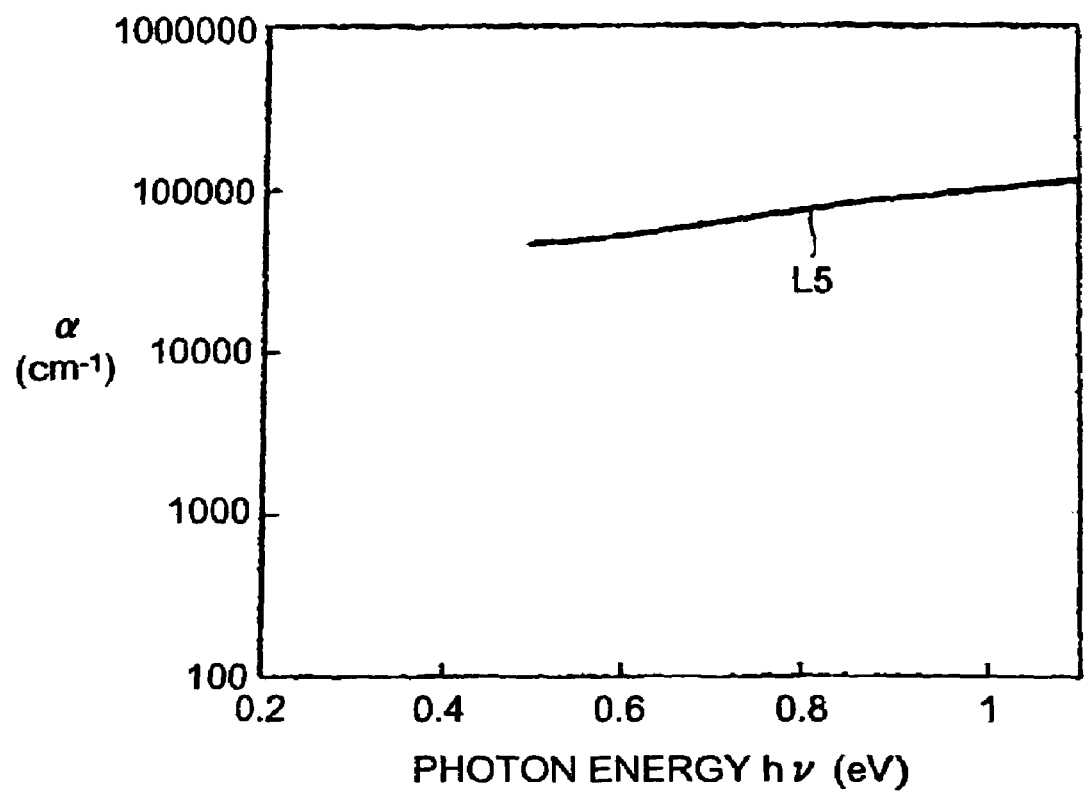
FIG. 10 is a graph showing changes in the absorption coefficient $\alpha$ of the iron silicide film obtained by Example 1 vs. photon energy hv.
Figure 11:
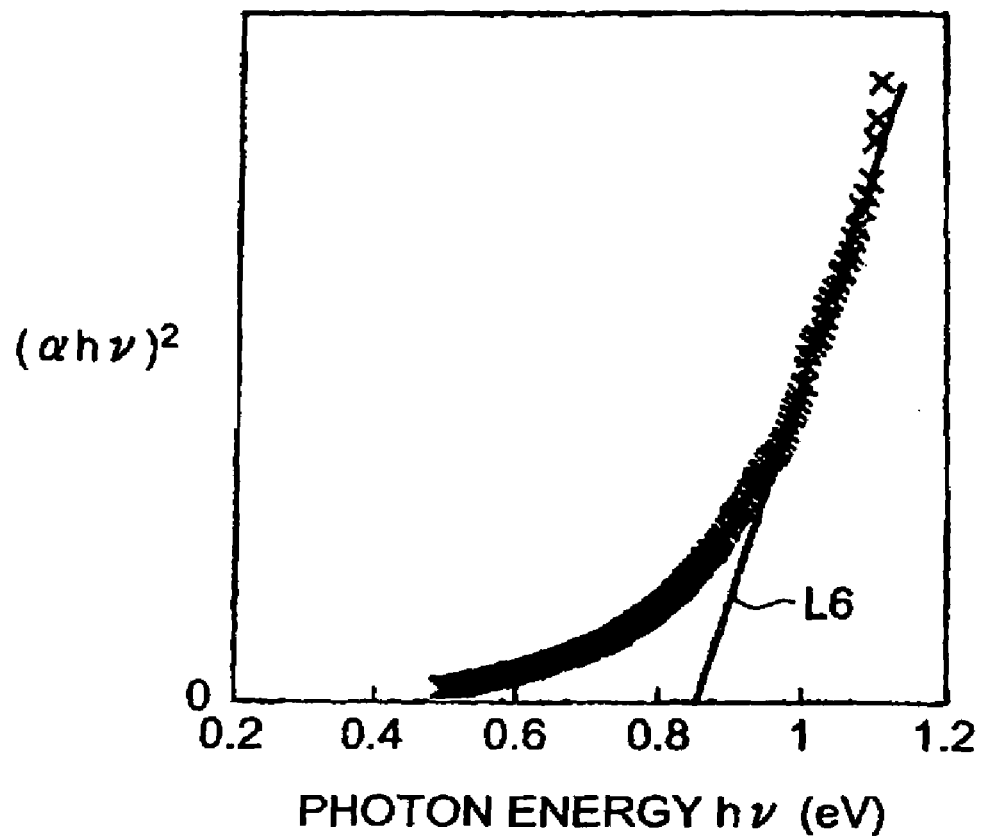
FIG. 11 is a graph showing changes in $(\alpha h\nu)^2$ value of the iron silicide film obtained by Example 1 vs. photon energy hv.

(2) Using the spectral transmittance and reflectance of the iron silicide film of Example 1 obtained by the above-mentioned (1), the absorption coefficient α per photon energy hv (h: Planck constant; v: number of vibrations) was calculated. FIG. 10 is a graph showing changes in the absorption coefficient α of the iron silicide film obtained by Example 1 vs. photon energy hv. Curve L5 in the graph is an indicator line connecting and smoothing plotted data. Using thus obtained absorption coefficient α and photon energy hv, $(\alpha h v)^2$ value was calculated. FIG. 11 is a graph showing changes in $(\alpha h v)^2$ value of the iron silicide film obtained by Example 1 vs. photon energy hv. Line L6 in the graph is an indicator line obtained by connecting plotted data (marked with "X") within the range where photon energy hv≈0.9 to 1.2 eV, and extrapolating the resulting curve.

FIG. 11 has proved that the iron silicide film obtained by Example 1 exhibits a semiconductor optical characteristic having an optical bandgap Eg(opt) of about 0.85 eV (the abscissa intercept of line L6 in FIG. 11). This Eg value matches the tendency of spectral transmittance indicated by curve L1 in FIG. 8. Since the iron silicide film of Example 1 formed at a substrate temperature of 250° C. has a semiconductor characteristic as such, it is seen that the i layer in the p-i-n junction in the photoelectric transducer and photoelectric transducer unit in accordance with the present invention can be formed by heat treatment at a very low temperature.

EXAMPLE 2

First, a metal electrode layer 12 having a thickness of 0.3 μm made of Ti was formed by sputtering on a glass substrate (substrate 11) having a main surface with a surface orientation of (100). Subsequently, an n layer 13 having a thickness of 30 nm made of n-type silicon was formed by plasma CVD on the metal electrode layer 12, and an i layer 14 made of an iron silicide film having a thickness of 400 nm was formed on the n layer 13 as in Example 1. Next, a p layer made of p-type silicon having a thickness of 20 nm was formed by plasma CVD on the i layer 14, so as to construct a p-i-n junction 100. Further, a transparent electrode layer 16 made of ITO having a thickness of 80 nm was formed on the p-i-n junction 100, so as to make a photoelectric transducer unit in accordance with the present invention configured as with the solar cell 10 shown in FIG. 3.

EXAMPLE 3

A photoelectric transducer unit in accordance with the present invention configured as with the hybrid solar cell 20 shown in FIG. 4 was made in the same manner as with Example 2 except that, after the i layer 14 (corresponding to the i layer 241) was formed, an i layer 242 made of amorphous silicon having a thickness of 200 nm was formed thereon by plasma CVD (under the film-forming condition with $SiH_4$ flow rate of 20 sccm, $H_2$ flow rate of 200 sccm, in-chamber pressure of 133 Pa, high-frequency power of 60 W, and substrate temperature of 200° C.), and that a p layer 15 was formed on the i layer 242, so as to construct a p-i-n junction 200.

EXAMPLE 4

A photoelectric transducer unit in accordance with the present invention configured as with the tandem solar cell 30 shown in FIG. 5 was made in the same manner as with Example 2 except that, after the p-i-n junction 100 was constructed, an n layer 33 similar to the n layer 13 was formed on the p layer 15, an i layer 34 similar to the i layer 242 was formed on the n layer 33, and a p layer 35 similar to the p layer 15 was formed on the i layer 34, so as to construct a p-i-n junction 300.

COMPARATIVE EXAMPLE 2

A photoelectric transducer unit was made as in Example 2 except that an i layer made of an iron silicide film having a thickness of 400 mm was formed in place of the i layer 14 as in Comparative Example 1.

Physical Property Evaluation of Photoelectric Transducer Unit

Using a solar simulator (product name: WXS-110-S) manufactured by WACOM Electric Co., Ltd., each of the photoelectric transducer units (monitor cells of 1 cm×1 cm) obtained by Examples 2 to 4 and Comparative Example 2 was irradiated with light under an intensity condition with AM 1.5 and 100 mW/cm$^2$, and I-V characteristics at that time were measured. Results are shown in the following:

(1) Photoelectric Transducer Unit of Example 2

A curve indicative of an I-V characteristic (diode characteristic) inherent in a semiconductor was obtained.

Jsc: 13.4 (mA/cm$^2$)
Voc: 0.45 (V)
F.F.: 0.60 (−)
Conversion efficiency: 3.6 (%)

(2) Photoelectric Transducer Unit of Example 3

A curve indicative of an I-V characteristic (diode characteristic) inherent in a semiconductor was obtained.

Jsc: 18.0 (MA/cm$^2$)
Voc: 0.51 (V)
F.F.: 0.56 (−)
Conversion efficiency: 5.1 (%)

(3) Photoelectric Transducer Unit of Example 4

A curve indicative of an I-V characteristic (diode characteristic) inherent in a semiconductor was obtained.

Jsc: 16.2 (mA/cm$^2$)
Voc: 1.27 (V)
F.F.: 0.50 (−)
Conversion efficiency: 10.3 (%)

(4) Photoelectric Transducer Unit of Comparative Example 2

No curve indicative of an I-V characteristic (diode characteristic) inherent in a semiconductor was obtained. Namely, an I-V characteristic represented by a substantially straight line in an I-V plane was obtained. Therefore, it was impossible to evaluate Jsc, Voc, F.F., and conversion efficiency. However, from the intercept of the line in I-V plane coordinates, simulative evaluations of characteristic values were tried. The following are their results as references:

Jsc (reference value): 9.22 (mA/cm$^2$)
Voc (reference value): 0.31 (V)
F.F. (reference value): 0.37 (−)
Conversion efficiency (reference value): 1.1 (%)

As explained in the foregoing, the method and apparatus for making an iron silicide film in accordance with the present invention can easily form, by low-temperature treatment, an iron silicide film having a favorable film quality while being adapted to exhibit semiconductor characteristics and employable in a device having a large area. The methods and apparatus for making a photoelectric transducer and a photoelectric transducer unit in accordance with the present invention can realize excellent device characteristics by comprising the iron silicide film of the present invention.

What is claimed is:

1. A method of making a photoelectric transducer, the method comprising:
    a p layer forming step of forming a p layer on a substrate;
    an n layer forming step of forming an n layer such that the n layer opposes the p layer; and
    an i layer forming step of forming an i layer including an iron silicide film between the p and n layers, the i layer forming step comprising a pressure adjusting step of keeping a fixed pressure about the substrate, a substrate heating step of heating the substrate, a gas supplying step of supplying a material gas including a silicon-atom-containing gas and a hydrogen gas to the substrate, a plasma forming step of applying a high-frequency power onto a region opposing the substrate so as to form a plasma including a chemical species derived from the material gas, and an iron supplying step of supplying an iron atom to the substrate,
    wherein the ratio between a supply amount of the silicon-atom-containing gas and a supply amount of the iron atom is adjusted in the gas and iron supplying steps such that the ratio between the iron and silicon atoms in the iron silicide film falls within a range of 1:1.7 to 1:3.5.

2. An apparatus for making a photoelectric transducer, the apparatus comprising:
    a p layer forming part for forming a p layer on a substrate;
    an n layer forming part for forming an n layer such that the n layer opposes the p layer;
    an i layer forming part for forming an i layer including an iron silicide film between the p and n layers; the i layer forming part comprising a chamber for accommodating the substrate; a substrate supporting part, placed within the chamber, for supporting the substrate; a pressure adjusting part, connected to the chamber, for keeping a fixed pressure within the chamber; a substrate heating part for heating the substrate; a gas supplying part, connected to the chamber, for supplying a material gas including a silicon-atom-containing gas and a hydrogen gas into the chamber; a plasma forming part for applying a high-frequency power onto a region opposing the substrate within the chamber so as to form a plasma including chemical species derived from the material gas; and an iron supplying part for supplying an iron atom to the substrate; and
    a supply amount controlling part, connected to the gas and iron supplying parts, for regulating the ratio between a supply amount of the silicon-atom-containing gas and a supply amount of the iron atom such that the ratio between the iron and silicon atoms in the iron silicide film falls within a range of 1:1.7 to 1:3.5.

3. A method of making a photoelectric transducer unit, the method comprising:
    a first electrode layer forming step of forming a first electrode layer on one side of a substrate;
    a second electrode layer forming step of forming a second electrode layer such that the second electrode layer opposes the first electrode layer;
    an n layer forming step of forming an n layer on the first electrode layer;
    a p layer forming step of forming a p layer on one side of the second electrode layer such that the p layer opposes the n layer; and
    an i layer forming step of forming an i layer including an iron silicide film between the p and n layers, the i layer forming step comprising a pressure adjusting step of keeping a fixed pressure about the substrate, a substrate heating step of heating the substrate, a gas supplying step of supplying a material gas including a silicon-atom-containing gas and a hydrogen gas to the substrate, a plasma forming step of applying a high-frequency power onto a region opposing the substrate so as to form a plasma including a chemical species derived from the material gas, and an iron supplying step of supplying an iron atom to the substrate, wherein the ratio between a supply amount of the silicon-atom-containing gas and a supply amount of the iron atom is adjusted in the gas and iron supplying steps such that the ratio between the iron and silicon atoms in the iron silicide film falls within a range of 1:1.7 to 1:3.5.

4. An apparatus for making a photoelectric transducer unit, the apparatus comprising:

a first electrode layer forming part for forming a first electrode layer on one side of a substrate;

a second electrode layer forming part for forming a second electrode layer such that the second electrode layer opposes the first electrode layer;

an n layer forming part for forming an n layer on the first electrode layer;

a p layer forming part for forming a p layer on one side of the second electrode layer such that the p layer opposes the n layer;

an i layer forming part for forming an i layer including an iron silicide film between the p and n layers; the i layer forming part comprising a chamber for accommodating the substrate; a substrate supporting part, placed within the chamber, for supporting the substrate; a pressure adjusting part, connected to the chamber, for keeping a fixed pressure within the chamber; a substrate heating part for heating the substrate; a gas supplying part, connected to the chamber, for supplying a material gas including a silicon-atom-containing gas and a hydrogen gas into the chamber; a plasma forming part for applying a high-frequency power onto a region opposing the substrate within the chamber so as to form a plasma including a chemical species derived from the material gas; and an iron supplying part for supplying an iron atom to the substrate; and a supply amount controlling part, connected to the gas and iron supplying parts, for regulating the ratio between a supply amount of the silicon-atom-containing gas and a supply amount of the iron atom such that the ratio between the iron and silicon atoms in the iron silicide film falls within a range of 1:1.7 to 1:3.5.

* * * * *